United States Patent
Liu et al.

(10) Patent No.: US 10,996,565 B2
(45) Date of Patent: May 4, 2021

(54) METHODS OF DETERMINING SCATTERING OF RADIATION BY STRUCTURES OF FINITE THICKNESSES ON A PATTERNING DEVICE

(71) Applicant: ASML NETHERLANDS B.V., Veldhoven (NL)

(72) Inventors: Peng Liu, Cupertino, CA (US); Ya Luo, Saratoga, CA (US); Yu Cao, Saratoga, CA (US); Yen-Wen Lu, Saratoga, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/483,452

(22) PCT Filed: Feb. 13, 2018

(86) PCT No.: PCT/EP2018/053589
§ 371 (c)(1),
(2) Date: Aug. 5, 2019

(87) PCT Pub. No.: WO2018/153735
PCT Pub. Date: Aug. 30, 2018

(65) Prior Publication Data
US 2020/0012196 A1  Jan. 9, 2020

Related U.S. Application Data

(60) Provisional application No. 62/462,337, filed on Feb. 22, 2017.

(51) Int. Cl.
*G03F 7/20* (2006.01)
*G06F 30/392* (2020.01)
(Continued)

(52) U.S. Cl.
CPC .......... *G03F 7/705* (2013.01); *G03F 7/70283* (2013.01); *G06F 30/392* (2020.01); *G06N 3/08* (2013.01); *G06F 30/39* (2020.01)

(58) Field of Classification Search
CPC .... G03F 7/705; G03F 7/70283; G06F 30/392; G06F 30/39; G06N 3/08
See application file for complete search history.

(56) References Cited

U.S. PATENT DOCUMENTS 6,046,792 A   4/2000 Van Der Werf et al.
6,115,108 A * 9/2000 Capodieci ........... G03F 7/70125
                                                   355/71
(Continued)

FOREIGN PATENT DOCUMENTS

DE   102005036892   2/2007

OTHER PUBLICATIONS

International Search Report and Written Opinion issued in corresponding PCT Patent Application No. PCT/EP2018/053589, dated Jun. 6, 2018.
(Continued)

*Primary Examiner* — Stacy Whitmore
(74) *Attorney, Agent, or Firm* — Pillsbury Winthrop Shaw Pittman LLP

(57) ABSTRACT

A method including: obtaining a characteristic of a portion of a design layout; determining a characteristic of M3D of a patterning device including or forming the portion; and training, by a computer, a neural network using training data including a sample whose feature vector includes the characteristic of the portion and whose supervisory signal includes the characteristic of the M3D. Also disclosed is a method including: obtaining a characteristic of a portion of a design layout; obtaining a characteristic of a lithographic process that uses a patterning device including or forming (Continued)

the portion; determining a characteristic of a result of the lithographic process; training, by a computer, a neural network using training data including a sample whose feature vector includes the characteristic of the portion and the characteristic of the lithographic process, and whose supervisory signal includes the characteristic of the result.

20 Claims, 13 Drawing Sheets

(51) Int. Cl.
  G06N 3/08 (2006.01)
  G06F 30/39 (2020.01)

(56) References Cited

U.S. PATENT DOCUMENTS

| | | | |
|---|---|---|---|
| 8,484,587 B2* | 7/2013 | Wei | G03F 7/70425 716/56 |
| 2002/0171825 A1* | 11/2002 | Krantz | G01N 21/95607 356/237.1 |
| 2006/0002513 A1* | 1/2006 | Bernhardt | A61B 6/544 378/97 |
| 2008/0134131 A1* | 6/2008 | Asano | G03F 7/70616 716/51 |
| 2009/0157360 A1 | 6/2009 | Ye et al. | |
| 2011/0145769 A1* | 6/2011 | Wei | G03F 7/70558 716/56 |
| 2013/0205263 A1* | 8/2013 | Lan | G03F 7/70625 716/52 |
| 2017/0285490 A1* | 10/2017 | Lam | G03F 7/705 |
| 2020/0073260 A1* | 3/2020 | Cao | G03F 7/70283 |

OTHER PUBLICATIONS

Taiwanese Office Action issued in corresponding Taiwanese Patent Application No. 107105968, dated Nov. 19, 2018.

Peng, Liu, et al.: "A full-chip 3D computational lithography framework", Proc. of SPIE, vol. 8326, Feb. 21, 2012.

\* cited by examiner

METHODS OF DETERMINING SCATTERING OF RADIATION BY STRUCTURES OF FINITE THICKNESSES ON A PATTERNING DEVICE

CROSS-REFERENCE TO RELATED APPLICATION

This application is the U.S. national phase entry of PCT Patent Application No. PCT/EP2018/053589, Feb. 13, 2018, which is based upon and claims the benefit of priority of U.S. Provisional Application No. 62/462,337, filed Feb. 22, 2017, and entitled "Methods of Determining Scattering of Radiation by Structures of Finite Thicknesses on a Patterning Device," the disclosure of which is incorporated herein by reference in its entirety.

TECHNICAL FIELD

The description herein relates generally to methods of determining scattering of radiation due to finite thicknesses of patterns on a patterning device for lithographic processes and lithographic projection apparatuses.

BACKGROUND

A lithographic projection apparatus can be used, for example, in the manufacture of integrated circuits (ICs). In such a case, a patterning device (e.g., a mask) may contain or provide a pattern corresponding to an individual layer of the IC ("design layout"), and this pattern can be transferred onto a target portion (e.g. comprising one or more dies) on a substrate (e.g., silicon wafer) that has been coated with a layer of radiation-sensitive material ("resist"), by methods such as irradiating the target portion through the pattern on the patterning device. In general, a single substrate contains a plurality of adjacent target portions to which the pattern is transferred successively by the lithographic projection apparatus, one target portion at a time. In one type of lithographic projection apparatuses, the pattern on the entire patterning device is transferred onto one target portion in one go; such an apparatus is commonly referred to as a stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the pattern on the patterning device are transferred to one target portion progressively. Since, in general, the lithographic projection apparatus will have a reduction ratio M (e.g., 4), the speed F at which the substrate is moved will be 1/M times that at which the projection beam scans the patterning device. More information with regard to lithographic devices as described herein can be gleaned, for example, from U.S. Pat. No. 6,046,792, incorporated herein by reference.

Prior to transferring the pattern from the patterning device to the substrate, the substrate may undergo various procedures, such as priming, resist coating and a soft bake. After exposure, the substrate may be subjected to other procedures ("post-exposure procedures"), such as a post-exposure bake (PEB), development, a hard bake and measurement/inspection of the transferred pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

Thus, manufacturing devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a patterning step, such as optical and/or nanoimprint lithography using a patterning device in a lithographic apparatus, to transfer a pattern on the patterning device to a substrate and typically, but optionally, involves one or more related pattern processing steps, such as resist development by a development apparatus, baking of the substrate using a bake tool, etching using the pattern using an etch apparatus, etc.

As noted, lithography is a central step in the manufacturing of device such as ICs, where patterns formed on substrates define functional elements of the devices, such as microprocessors, memory chips, etc. Similar lithographic techniques are also used in the formation of flat panel displays, micro-electro mechanical systems (MEMS) and other devices.

As semiconductor manufacturing processes continue to advance, the dimensions of functional elements have continually been reduced while the amount of functional elements, such as transistors, per device has been steadily increasing over decades, following a trend commonly referred to as "Moore's law". At the current state of technology, layers of devices are manufactured using lithographic projection apparatuses that project a design layout onto a substrate using illumination from a deep-ultraviolet illumination source, creating individual functional elements having dimensions well below 100 nm, i.e. less than half the wavelength of the radiation from the illumination source (e.g., a 193 nm illumination source).

This process in which features with dimensions smaller than the classical resolution limit of a lithographic projection apparatus are printed, is commonly known as low-$k_1$ lithography, according to the resolution formula $CD=k_1 \times \lambda/NA$, where $\lambda$ is the wavelength of radiation employed (currently in most cases 248 nm or 193 nm), NA is the numerical aperture of projection optics in the lithographic projection apparatus, CD is the "critical dimension"—generally the smallest feature size printed—and $k_1$ is an empirical resolution factor. In general, the smaller $k_1$ the more difficult it becomes to reproduce a pattern on the substrate that resembles the shape and dimensions planned by a designer in order to achieve particular electrical functionality and performance. To overcome these difficulties, sophisticated fine-tuning steps are applied to the lithographic projection apparatus, the design layout, or the patterning device. These include, for example, but not limited to, optimization of NA and optical coherence settings, customized illumination schemes, use of phase shifting patterning devices, optical proximity correction (OPC, sometimes also referred to as "optical and process correction") in the design layout, or other methods generally defined as "resolution enhancement techniques" (RET). The term "projection optics" as used herein should be broadly interpreted as encompassing various types of optical systems, including refractive optics, reflective optics, apertures and catadioptric optics, for example. The term "projection optics" may also include components operating according to any of these design types for directing, shaping or controlling the projection beam of radiation, collectively or singularly. The term "projection optics" may include any optical component in the lithographic projection apparatus, no matter where the optical component is located on an optical path of the lithographic projection apparatus. Projection optics may include optical components for shaping, adjusting and/or projecting radiation from the source before the radiation passes the patterning device, and/or optical components for shaping, adjusting and/or projecting the radiation after the radiation passes the patterning device. The projection optics generally exclude the source and the patterning device.

SUMMARY

In an embodiment, there is provided a method comprising: obtaining characteristics of a portion of a design layout; determining characteristics of M3D of a patterning device comprising or forming the portion; using a computer, training a neural network using training data comprising a sample whose feature vector comprises the characteristics of the portion and whose supervisory signal comprises the characteristics of M3D.

According to an embodiment, the design layout is a binary design layout or a continuous tone design layout.

According to an embodiment, the characteristics of the portion comprise geometrical characteristics of patterns in the portion, statistical characteristics of the patterns in the portion, parameterization of the portion, or an image derived from the portion.

According to an embodiment, the parameterization of the portion is a projection of the portion on one or more basis functions.

According to an embodiment, the image is a pixelated image, a binary image or a continuous tone image.

According to an embodiment, the characteristics of M3D comprise parameters of a M3D mask transmission function of the patterning device.

According to an embodiment, the characteristics of M3D are determined based on the portion.

According to an embodiment, the characteristics of M3D are determined using a computational model.

According to an embodiment, the method further comprises determining the characteristics of M3D from a result of a patterning process that uses the patterning device.

According to an embodiment, the result is an image formed on a substrate by the patterning process, or a characteristic of the image.

According to an embodiment, the characteristics of the portion comprise geometric components of the portion, or continuous tone rendering of the geometric components.

Disclosed herein is a method comprising: obtaining characteristics of a portion of a design layout; obtaining characteristics of a patterning process that uses a patterning device comprising or forming the portion; determining characteristics of a result of the patterning process; using a computer, training a neural network using training data comprising a sample whose feature vector comprises the characteristics of the portion and the characteristics of the patterning process, and whose supervisory signal comprises the characteristics of the result.

According to an embodiment, the design layout is a binary design layout or a continuous tone design layout.

According to an embodiment, the characteristics of the portion comprise geometrical characteristics of patterns in the portion, statistical characteristics of the patterns in the portion, parameterization of the portion, or an image derived from the portion.

According to an embodiment, the parameterization of the portion is a projection of the portion on one or more basis functions.

According to an embodiment, the image is a pixelated image, a binary image or a continuous tone image.

According to an embodiment, the characteristics of the patterning process comprise characteristics of an illumination source of a lithographic apparatus used in the patterning process, characteristics of projection optics of the lithographic apparatus, characteristics of a post-exposure procedure, or a combination thereof.

According to an embodiment, the characteristics of the result are determined based on the portion and the patterning process.

According to an embodiment, the result is an image formed on a substrate by the patterning process, or a characteristic of the image.

According to an embodiment, the characteristics of the result are determined using a computational model.

According to an embodiment, the characteristics of the result are selected from a critical dimension, a mask error enhancement factor, a process window, a yield, and/or any combination selected therefrom.

According to an embodiment, the characteristics of the portion comprise geometric components of the portion, or continuous tone rendering of the geometric components.

According to an embodiment, the method further comprises determining, using the neural network, a M3D mask transmission function of the patterning device.

According to an embodiment, the method further comprises determining an image produced by the patterning process, using the M3D mask transmission function.

According to an embodiment, determining the image comprises determining an electromagnetic field of radiation after radiation interacts with the patterning device by using the M3D mask transmission function and an electromagnetic field of the radiation before the radiation interacts with the patterning device.

Disclosed herein is a computer program product comprising a non-transitory computer readable medium having instructions recorded thereon, the instructions when executed by a computer implementing any of the methods herein.

DETAILED DESCRIPTION

Figure 1:
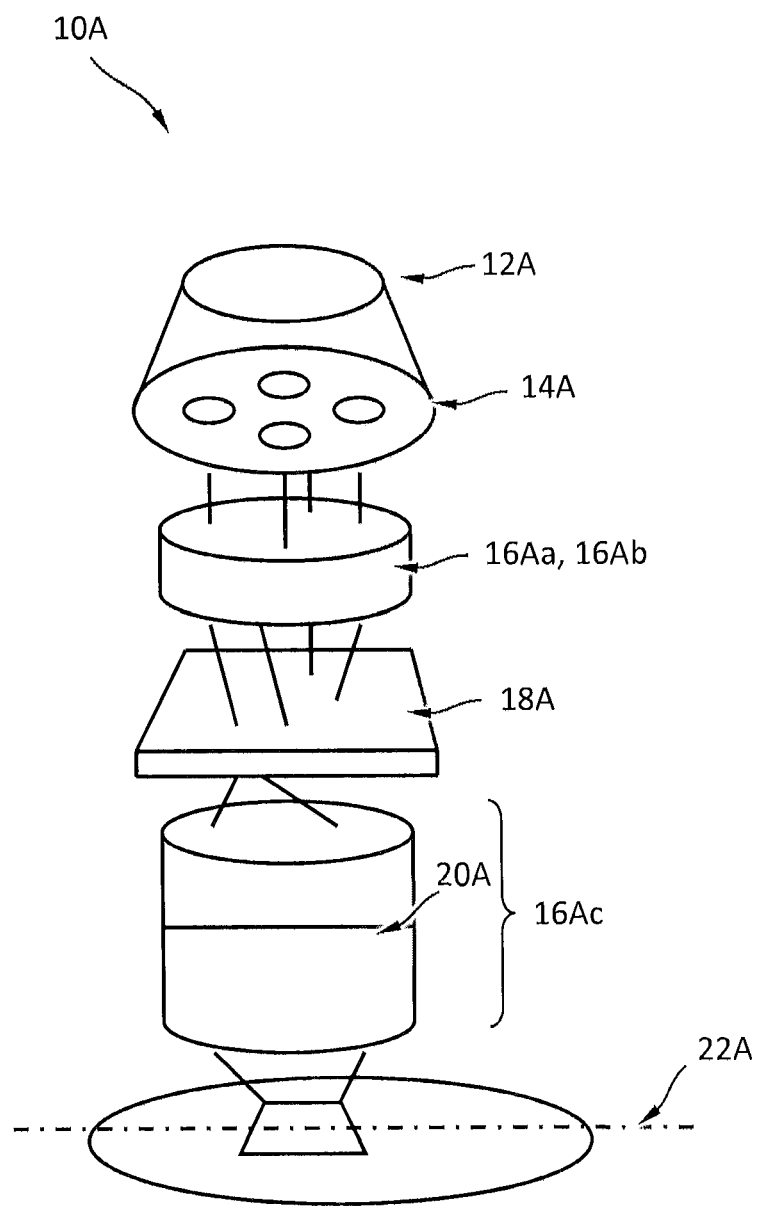
FIG. 1 shows a block diagram of various subsystems of a lithography system.

Although specific reference may be made in this text to the manufacture of ICs, it should be explicitly understood that the description herein has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as interchangeable with the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The patterning device can comprise, or can form, one or more design layouts. The design layout can be generated utilizing CAD (computer-aided design) programs, this process often being referred to as EDA (electronic design automation). Most CAD programs follow a set of predetermined design rules in order to create functional design layouts/patterning devices. These rules are set by processing and design limitations. For example, design rules define the space tolerance between devices (such as gates, capacitors, etc.) or interconnect lines, so as to ensure that the devices or lines do not interact with one another in an undesirable way. One or more of the design rule limitations may be referred to as "critical dimension" (CD). A critical dimension of a device can be defined as the smallest width of a line or hole or the smallest space between two lines or two holes. Thus, the CD determines the overall size and density of the designed device. Of course, one of the goals in device fabrication is to faithfully reproduce the original design intent on the substrate (via the patterning device).

The term "mask" or "patterning device" as employed in this text may be broadly interpreted as referring to a generic patterning device that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning devices include:

a programmable mirror array. An example of such a device is a matrix-addressable surface having a viscoelastic control layer and a reflective surface. The basic principle behind such an apparatus is that (for example) addressed areas of the reflective surface reflect incident radiation as diffracted radiation, whereas unaddressed areas reflect incident radiation as undiffracted radiation. Using an appropriate filter, the said undiffracted radiation can be filtered out of the reflected beam, leaving only the diffracted radiation behind; in this manner, the beam becomes patterned according to the addressing pattern of the matrix-addressable surface. The required matrix addressing can be performed using suitable electronic means.

a programmable LCD array.

As a brief introduction, FIG. 1 illustrates an exemplary lithographic projection apparatus 10A. Major components are a radiation source 12A, which may be a deep-ultraviolet excimer laser source or other type of source including an extreme ultra violet (EUV) source (as discussed above, the lithographic projection apparatus itself need not have the radiation source), illumination optics which, e.g., define the partial coherence (denoted as sigma) and which may include optics 14A, 16Aa and 16Ab that shape radiation from the source 12A; a patterning device 18A; and transmission optics 16Ac that project an image of the patterning device pattern onto a substrate plane 22A. An adjustable filter or aperture 20A at the pupil plane of the projection optics may restrict the range of beam angles that impinge on the substrate plane 22A, where the largest possible angle defines the numerical aperture of the projection optics NA=n sin($\Theta_{max}$), wherein n is the refractive index of the media between the substrate and the last element of the projection optics, and $\Theta_{max}$ is the largest angle of the beam exiting from the projection optics that can still impinge on the substrate plane 22A.

In a lithographic projection apparatus, a source provides illumination (i.e. radiation) to a patterning device and projection optics direct and shape the illumination, via the patterning device, onto a substrate. The projection optics may include at least some of the components 14A, 16Aa, 16Ab and 16Ac. An aerial image (AI) is the radiation intensity distribution at substrate level. A resist layer on the substrate is exposed and the aerial image is transferred to the resist layer as a latent "resist image" (RI) therein. The resist image (RI) can be defined as a spatial distribution of solubility of the resist in the resist layer. A resist model can be used to calculate the resist image from the aerial image, an example of which can be found in U.S. Patent Application Publication No. U.S. 2009-0157360, the disclosure of which is hereby incorporated by reference in its entirety. The resist model is related only to properties of the resist layer (e.g., effects of chemical processes which occur during exposure, PEB and development). Optical properties of the lithographic projection apparatus (e.g., properties of the source, the patterning device and the projection optics) dictate the aerial image. Since the patterning device used in the lithographic projection apparatus can be changed, it may be desirable to separate the optical properties of the patterning device from the optical properties of the rest of the lithographic projection apparatus including at least the source and the projection optics.

One aspect of understanding a lithographic process is understanding the interaction of the radiation and the patterning device. The electromagnetic field of the radiation after the radiation passes the patterning device may be determined from the electromagnetic field of the radiation before the radiation reaches the patterning device and a function that characterizes the interaction. This function may be referred to as the mask transmission function (which can be used to describe the interaction by a transmissive patterning device and/or a reflective patterning device).

The mask transmission function may have a variety of different forms. One form is binary. A binary mask transmission function has either of two values (e.g., zero and a positive constant) at any given location on the patterning device. A mask transmission function in the binary form may be referred to as a binary mask. Another form is continuous. Namely, the modulus of the transmittance (or reflectance) of the patterning device is a continuous function of the location on the patterning device. The phase of the transmittance (or reflectance) may also be a continuous function of the location on the patterning device. A mask transmission function in the continuous form may be referred to as a continuous transmission mask (CTM).

The thin-mask approximation, also called the Kirchhoff boundary condition, is widely used to simplify the determination of the interaction of the radiation and the patterning device. The thin-mask approximation assumes that the thickness of the structures on the patterning device is very small compared with the wavelength and that the widths of the structures on the mask are very large compared with the wavelength. Therefore, the thin-mask approximation assumes the electromagnetic field after the patterning device is the multiplication of the incident electromagnetic field with the mask transmission function. However, as lithographic processes use radiation of shorter and shorter wavelengths, and the structures on the patterning device become smaller and smaller, the assumption of the thin-mask approximation can break down. For example, interaction of the radiation with the structures (e.g., edges between the top surface and a sidewall) because of their finite thicknesses ("mask 3D effect" or "M3D") may become significant. Encompassing this scattering in the mask transmission function may enable the mask transmission function to better capture the interaction of the radiation with the patterning device. A mask transmission function under the thin-mask approximation may be referred to as a thin-mask transmission function. A mask transmission function encompassing M3D may be referred to as a M3D mask transmission function.

Figure 2:
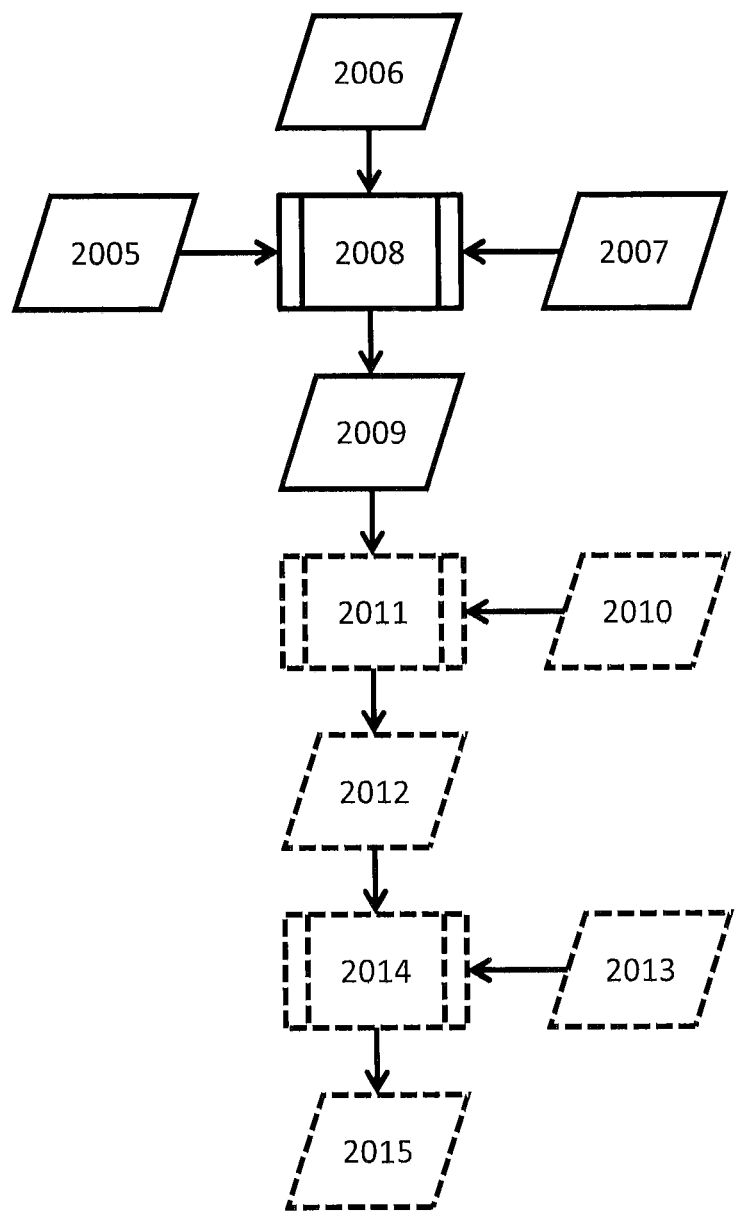
FIG. 2 shows a flowchart of a method for simulation of an image where M3D is taken into account, according to an embodiment.

FIG. 2 is a flowchart of a method for determining an image (e.g., aerial image, resist image, or etch image) that is a product of a patterning process involving a lithographic process, where M3D is taken into account, according to an embodiment. In procedure 2008, a M3D mask transmission function 2006 of a patterning device, an illumination source model 2005, and a projection optics model 2007 are used to determine (e.g., simulate) an aerial image 2009. The aerial image 2009 and a resist model 2010 may be used in optional procedure 2011 to determine (e.g., simulate) a resist image 2012. The resist image 2012 and an etch model 2013 may be used in optional procedure 2014 to determine (e.g., simulate) an etch image 2015. The etch image can be defined as a spatial distribution of the amount of etching in the substrate after the substrate is etched using the developed resist thereon as an etch mask.

As noted above, the mask transmission function (e.g., a thin-mask or M3D mask transmission function) of a patterning device is a function that determines the electromagnetic field of the radiation after it interacts with the patterning device based on the electromagnetic field of the radiation before it interacts with the patterning device. As described above, the mask transmission function can describe the interaction for a transmissive patterning device, or a reflective patterning device.

Figure 3:
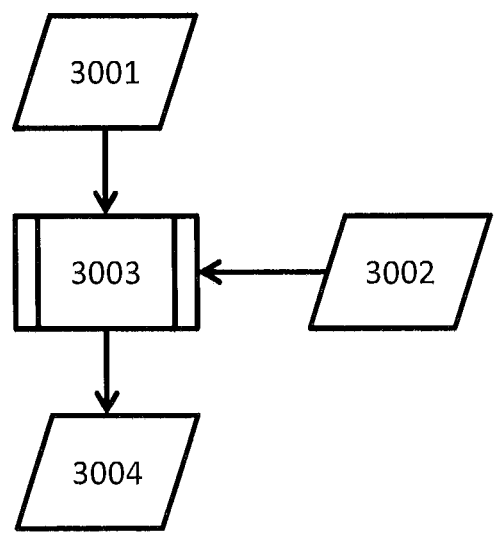
FIG. 3 schematically shows a flow chart for using a mask transmission function.

FIG. 3 schematically shows a flow chart for using the mask transmission function. The electromagnetic field 3001 of the radiation before it interacts with the patterning device and the mask transmission function 3002 are used in procedure 3003 to determine the electromagnetic field 3004 of the radiation after it interacts with the patterning device. The mask transmission function 3002 may be a thin-mask transmission function. The mask transmission function 3002 may be a M3D mask transmission function. In a generic mathematical form, the relationship between the electromagnetic field 3001 and the electromagnetic field 3004 may be expressed in a formula as $E_a(r)=T(E_b(r))$, wherein $E_a(r)$ is the electric component of the electromagnetic field 3004; $E_b(r)$ is the electric component of the electromagnetic field 3001; and T is the mask transmission function.

M3D (e.g., as represented by one or more parameters of the M3D mask transmission function) of structures on a patterning device may be determined by a computational or an empirical model. In an example, a computational model may involve rigorous simulation (e.g., using a Finite-Discrete-Time-Domain (FDTD) algorithm or a Rigorous-Coupled Waveguide Analysis (RCWA) algorithm) of M3D of all the structures on the patterning device. In another example, a computational model may involve rigorous simulation of M3D of certain portions of the structures that tend to have large M3D, and adding M3D of these portions to a thin-mask transmission function of all the structures on the patterning device. However, rigorous simulation tends to be computationally expensive.

An empirical model, in contrast, would not simulate M3D; instead, the empirical model determines M3D based on correlations between the input (e.g., one or more characteristics of the design layout comprised or formed by the patterning device, one or more characteristics of the patterning device such as its structures and material composition, and one or more characteristics of the illumination used in the lithographic process such as the wavelength) to the empirical model and M3D.

An example of an empirical model is a neural network. A neural network, also referred to as an artificial neural network (ANN), is "a computing system made up of a number of simple, highly interconnected processing elements, which process information by their dynamic state response to external inputs." *Neural Network Primer: Part I*, Maureen Caudill, AI Expert, Feb. 1989. Neural networks are processing devices (algorithms or actual hardware) that are loosely modeled after the neuronal structure of the mammalian cerebral cortex but on much smaller scales. A neural network might have hundreds or thousands of processor units, whereas a mammalian brain has billions of neurons with a corresponding increase in magnitude of their overall interaction and emergent behavior.

A neural network may be trained (i.e., whose parameters are determined) using a set of training data. The training data may comprise or consist of a set of training samples. Each sample may be a pair comprising or consisting of an input object (typically a vector, which may be called a feature vector) and a desired output value (also called the supervisory signal). A training algorithm analyzes the training data and adjusts the behavior of the neural network by adjusting the parameters of the neural network based on the training data. The neural network after training can be used for mapping new samples.

In the context of determining M3D, the feature vector may include one or more characteristics (e.g., shape, arrangement, size, etc.) of the design layout comprised or formed by the patterning device, one or more characteristics (e.g., one or more physical properties such as a dimension, a refractive index, material composition, etc.) of the patterning device, and one or more characteristics (e.g., the wavelength) of the illumination used in the lithographic process. The supervisory signal may include one or more characteristics of the M3D (e.g., one or more parameters of the M3D mask transmission function).

Given a set of N training samples of the form $\{(x_1, y_1), (x_2, y_2), \ldots, (x_N, y_N)\}$ such that $x_i$ is the feature vector of the i-th example and $y_i$ is its supervisory signal, a training algorithm seeks a neural network g: X→Y, where X is the input space and Y is the output space. A feature vector is an n-dimensional vector of numerical features that represent some object. The vector space associated with these vectors is often called the feature space. It is sometimes convenient to represent g using a scoring function f: X×Y→$\mathbb{R}$, such that g is defined as returning the y value that gives the highest score: $g(x)=\arg\max_y f(x, y)$. Let F denote the space of scoring functions.

The neural network may be probabilistic where g takes the form of a conditional probability model $g(x)=P(y|x)$, or f takes the form of a joint probability model $f(x, y)=P(x, y)$.

There are two basic approaches to choosing f or g: empirical risk minimization and structural risk minimization. Empirical risk minimization seeks the neural network that best fits the training data. Structural risk minimization includes a penalty function that controls the bias/variance tradeoff.

In both cases, it is assumed that the training set comprises or consists of one or more samples of independent and identically distributed pairs $(x_i, y_i)$. In order to measure how well a function fits the training data, a loss function L: Y×Y→$\mathbb{R}^{\geq 0}$ is defined. For training sample $(x_i, y_i)$, the loss of predicting the value $\hat{y}$ is $L(y_i, \hat{y})$.

The risk R(g) of function g is defined as the expected loss of g. This can be estimated from the training data as $$R_{emp}(g) = \frac{1}{N}\sum_i L(y_i, g(x_i)).$$

Figure 4:
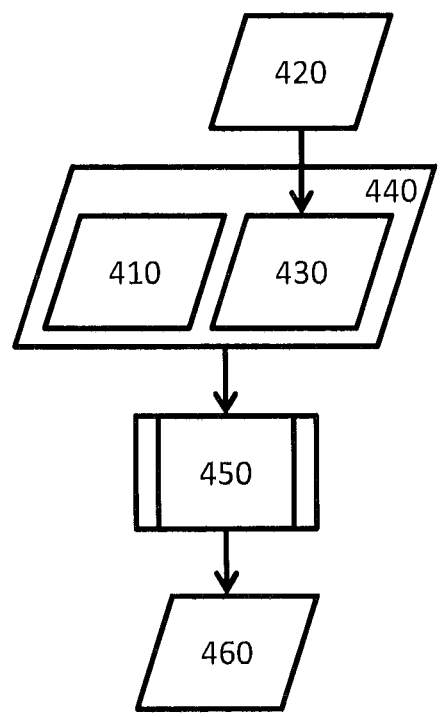
FIG. 4 schematically shows a flowchart for a method of training a neural network that determines M3D of structures on a patterning device, according to an embodiment.

FIG. 4 schematically shows a flowchart for a method of training a neural network that determines M3D (e.g., as represented by one or more parameters of the M3D mask transmission function) of one or more structures on a patterning device, according to an embodiment. Values of one or more characteristics 410 of a portion of a design layout are obtained. The design layout may be a binary design layout, a continuous tone design layout (e.g., rendered from a binary design layout), or a design layout of another suitable form. The one or more characteristics 410 may include one or more geometrical characteristics (e.g., absolute location, relative location, and/or shape) of one or more patterns in the portion. The one or more characteristics 410 may include a statistical characteristic of the one or more patterns in the portion. The one or more characteristics 410 may include parameterization of the portion (e.g., values of a function of the one or more patterns in the portion), such as projection on a certain basis function. The one or more characteristics 410 may include an image (pixelated, binary, or continuous tone) derived from the portion. Values of one or more characteristics 430 of M3D of a patterning device comprising or forming the portion are determined using any suitable method. The values of one or more characteristics 430 of M3D may be determined based on the portion or the one or more characteristics 410 thereof. For example, the one or more characteristics 430 of the M3D may be determined using a computational model. For example, the one or more characteristics 430 may include one or more parameters of the M3D mask transmission function of the patterning device. The values of one or more characteristics 430 of M3D may be derived from a result 420 of the patterning process that uses the patterning device. The result 420 may be an image (e.g., aerial image, resist image, and/or etch image) formed on a substrate by the patterning process, or a characteristic (e.g., CD, mask error enhancement factor (MEEF), process window, yield, etc.) thereof. The values of the one or more characteristics 410 of the portion of the design layout and the one or more characteristics 430 of M3D are included in training data 440 as one or more samples. The one or more characteristics 410 are the feature vector of the sample and the one or more characteristics 430 are the supervisory signal of the sample. In procedure 450, a neural network 460 is trained using the training data 440.

Figure 5:
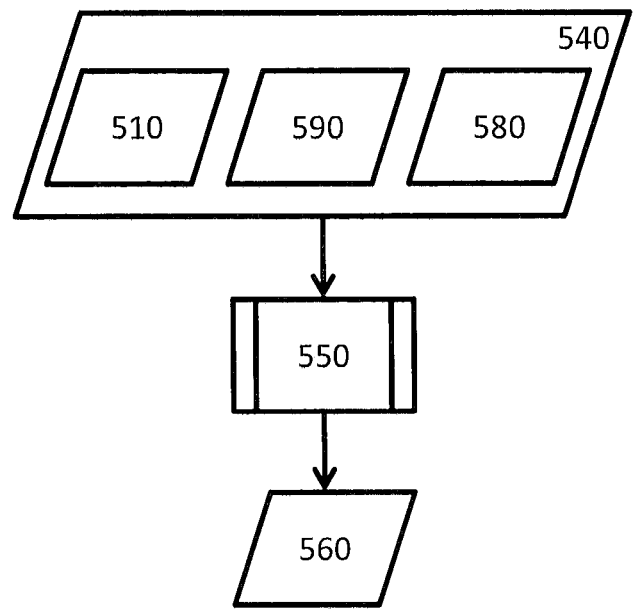
FIG. 5 schematically shows a flowchart for a method of training a neural network that determines M3D of structures on a patterning device, according to an embodiment.

FIG. 5 schematically shows a flowchart for a method of training a neural network that determines M3D (e.g., as represented by one or more parameters of the M3D mask transmission function) of one or more structures on a patterning device, according to an embodiment. Values of one or more characteristics 510 of a portion of a design layout are obtained. The design layout may be a binary design layout, a continuous tone design layout (e.g., rendered from a binary design layout), or a design layout of another suitable form. The one or more characteristics 510 may include one or more geometrical characteristics (e.g., absolute location, relative location, and/or shape) of one or more patterns in the portion. The one or more characteristics 510 may include one or more statistical characteristics of the one or more patterns in the portion. The one or more characteristics 510 may include parameterization of the portion (i.e., values of one or more functions of one or more patterns in the portion), such as projection on a certain basis function. The one or more characteristics 510 may include an image (pixelated, binary, or continuous tone) derived from the portion. Values of one or more characteristics 590 of the patterning process are also obtained. The one or more characteristics 590 of the patterning process may include one or more characteristics of the illumination source of the lithographic apparatus used in the lithographic process, one or more characteristics of the projection optics of the lithographic apparatus used in the lithographic process, one or more characteristics of a post-exposure procedure (e.g., resist development, post exposure bake, etching, etc.), or a combination selected therefrom. Values of one or more characteristics 580 of a result of the patterning process that uses a patterning device comprising or forming the portion are determined. The values of the one or more characteristics 580 of the result may be determined based on the portion and the patterning process. The result may be an image (e.g., aerial image, resist image, and/or etch image) formed on a substrate by the patterning process. The one or more characteristics 580 may be CD, mask error enhancement factor (MEEF), a process window, or a yield. The one or more characteristics 580 of the result may be determined using a computational model. The values of the one or more characteristics 510 of the portion of the design layout, the one or more characteristics 590 of the patterning process, and the one or more characteristics 580 of the result are included in training data 540 as one or more samples. The one or more characteristics 510 and the one or more characteristics 590 are the feature vector of the sample and the one or more characteristics 580 are the supervisory signal of the sample. In procedure 550, a neural network 560 is trained using the training data 540.

Figure 6:
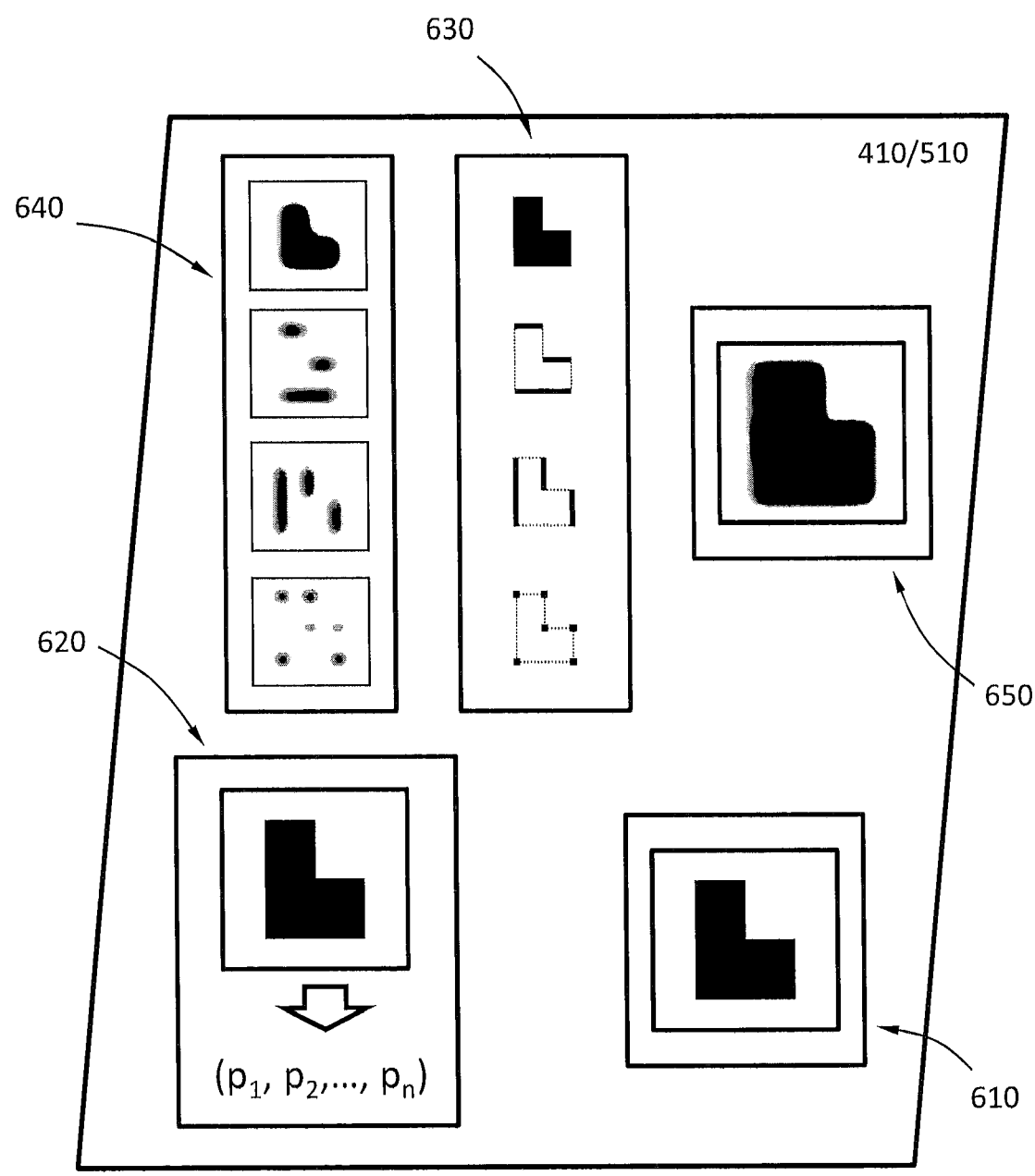
FIG. 6 schematically shows examples of the characteristics of a portion of a design layout used in the methods of FIG. 4 or FIG. 5.

FIG. 6 schematically shows that examples of the one or more characteristics 410 and 510 may include the portion 610 of the design layout, parameterization 620 of the portion, one or more geometric components 630 (e.g., one or more areas, one or more corners, one or more edges, etc.) of the portion, a continuous tone rendering 640 of the one or more geometric components, and/or a continuous tone rendering 650 of the portion.

Figure 7A:
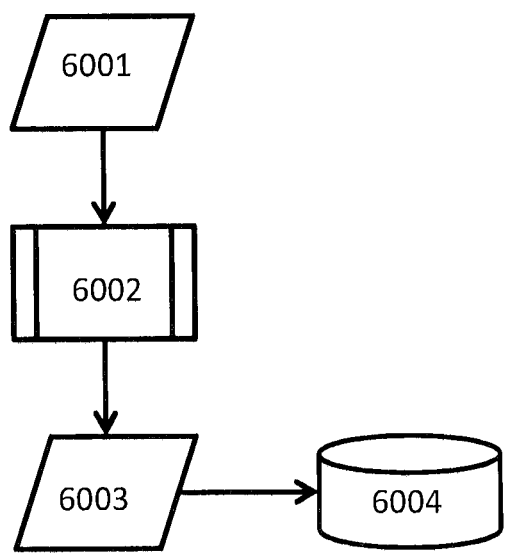
FIG. 7A schematically shows a flow chart where M3D models may be derived for a number of patterning processes and stored in a database for future use.

FIG. 7A schematically shows a flow chart of one or more M3D models being derived for a number of patterning processes and stored in a database for future use. One or more characteristics of a patterning process 6001 are used to derive a M3D model 6003 for the patterning process 6001 in procedure 6002. The M3D model 6003 may be obtained by simulation. The M3D model 6003 is stored in a database 6004.

Figure 7B:
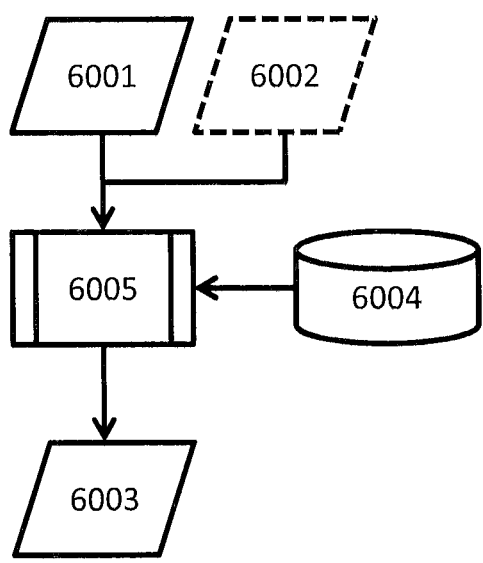
FIG. 7B schematically shows a flow chart where a M3D model may be retrieved from a database based on the patterning process.

FIG. 7B schematically shows a flow chart of a M3D model being retrieved from a database based on the patterning process. In procedure 6005, one or more characteristics of a patterning process 6001 are used to query the database 6004 and retrieve a M3D model 6003 for the patterning process 6001.

Figure 8:
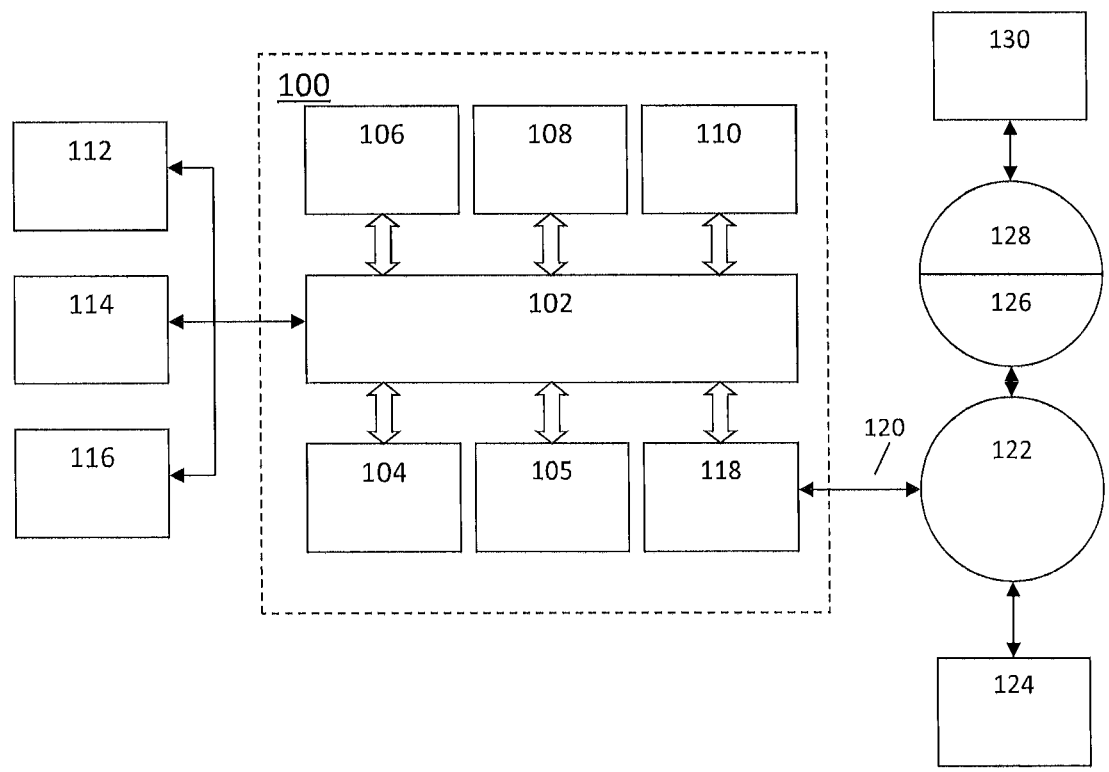
FIG. 8 is a block diagram of an example computer system.

FIG. 8 is a block diagram that illustrates a computer system 100 which can assist in implementing the methods, flows or the apparatus disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of one or more methods described herein may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 may also include a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. One such downloaded application may provide all or part of a method described herein, for example. The received code may be executed by processor 104 as it is received, and/or stored in storage device 110, or other non-volatile storage for later execution. In this manner, computer system 100 may obtain application code in the form of a carrier wave.

Figure 9:
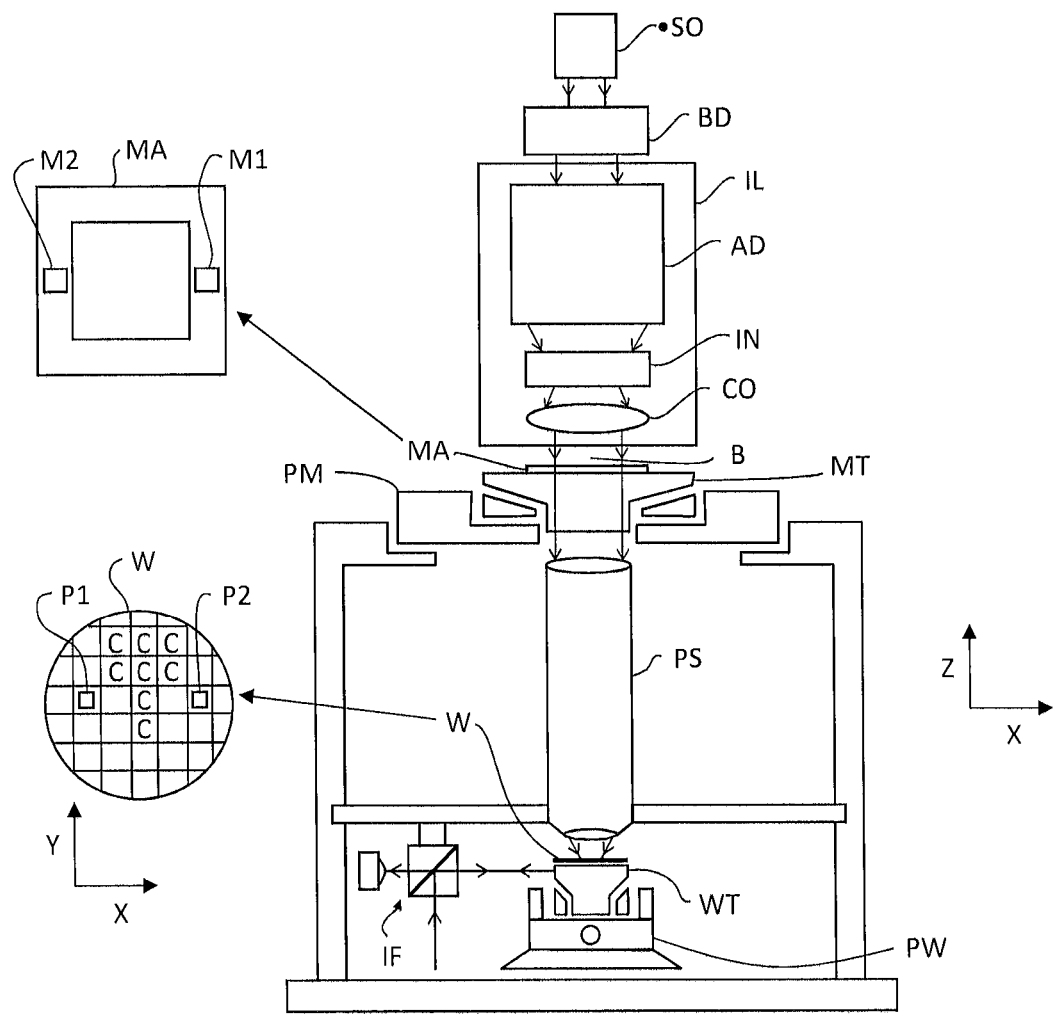
FIG. 9 is a schematic diagram of a lithographic projection apparatus.

FIG. 9 schematically depicts an exemplary lithographic projection apparatus in conjunction with the techniques described herein can be utilized. The apparatus comprises:
- an illumination system IL, to condition a beam B of radiation. In this particular case, the illumination system also comprises a radiation source SO;
- a first object table (e.g., patterning device table) MT provided with a patterning device holder to hold a patterning device MA (e.g., a reticle), and connected to a first positioner to accurately position the patterning device with respect to item PS;
- a second object table (substrate table) WT provided with a substrate holder to hold a substrate W (e.g., a resist-coated silicon wafer), and connected to a second positioner to accurately position the substrate with respect to item PS;
- a projection system ("lens") PS (e.g., a refractive, catoptric or catadioptric optical system) to image an irradiated portion of the patterning device MA onto a target portion C (e.g., comprising one or more dies) of the substrate W.

As depicted herein, the apparatus is of a transmissive type (i.e., has a transmissive patterning device). However, in general, it may also be of a reflective type, for example (with a reflective patterning device). The apparatus may employ a different kind of patterning device to classic mask; examples include a programmable mirror array or LCD matrix.

The source SO (e.g., a mercury lamp or excimer laser, LPP (laser produced plasma) EUV source) produces a beam of radiation. This beam is fed into an illumination system (illuminator) IL, either directly or after having traversed conditioning means, such as a beam expander Ex, for example. The illuminator IL may comprise adjusting means AD for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam B impinging on the patterning device MA has a desired uniformity and intensity distribution in its cross-section.

It should be noted with regard to FIG. 9 that the source SO may be within the housing of the lithographic projection apparatus (as is often the case when the source SO is a mercury lamp, for example), but that it may also be remote from the lithographic projection apparatus, the radiation beam that it produces being led into the apparatus (e.g., with the aid of suitable directing mirrors); this latter scenario is often the case when the source SO is an excimer laser (e.g., based on KrF, ArF or $F_2$ lasing).

The beam PB subsequently intercepts the patterning device MA, which is held on a patterning device table MT. Having traversed the patterning device MA, the beam B passes through the lens PL, which focuses the beam B onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the patterning device MA with respect to the path of the beam B, e.g., after mechanical retrieval of the patterning device MA from a patterning device library, or during a scan. In general, movement of the object tables MT, WT will be realized with the aid of a long-stroke module (coarse positioning) and a short-stroke module (fine positioning), which are not explicitly depicted in FIG. 9. However, in the case of a stepper (as opposed to a step-and-scan tool) the patterning device table MT may just be connected to a short stroke actuator, or may be fixed.

The depicted tool can be used in two different modes:
- In step mode, the patterning device table MT is kept essentially stationary, and an entire patterning device image is projected in one go (i.e., a single "flash") onto a target portion C. The substrate table WT is then shifted in the x and/or y directions so that a different target portion C can be irradiated by the beam PB;
- In scan mode, essentially the same scenario applies, except that a given target portion C is not exposed in a single "flash". Instead, the patterning device table MT is movable in a given direction (the so-called "scan direction", e.g., the y direction) with a speed v, so that the projection beam B is caused to scan over a patterning device image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 10:
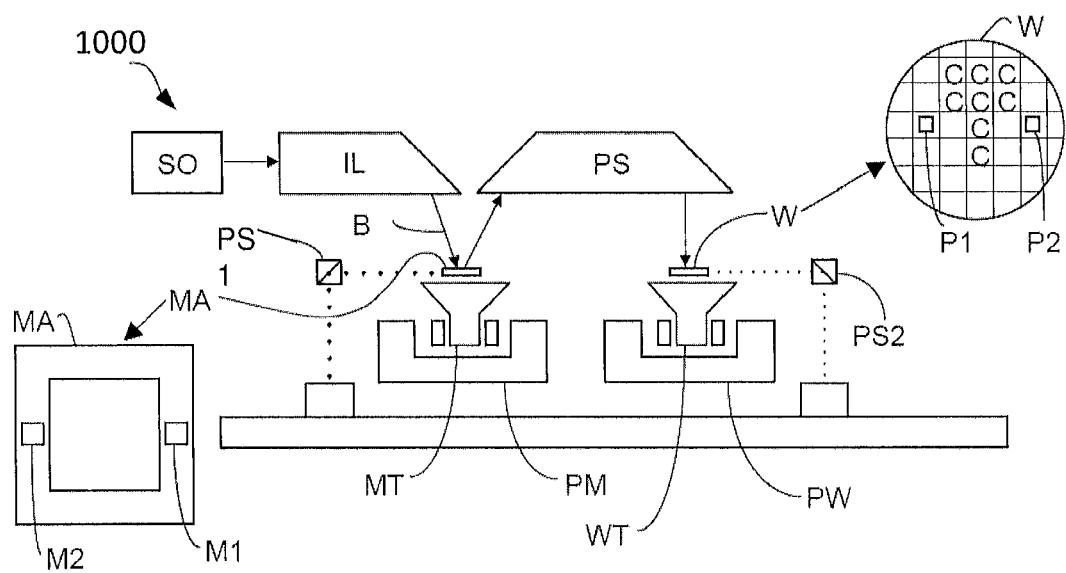
FIG. 10 is a schematic diagram of another lithographic projection apparatus.

FIG. 10 schematically depicts another exemplary lithographic projection apparatus 1000 in conjunction with the techniques described herein can be utilized.

The lithographic projection apparatus 1000 comprises:
- a source collector module SO
- an illumination system (illuminator) IL configured to condition a radiation beam B (e.g. EUV radiation).
- a support structure (e.g. a patterning device table) MT constructed to support a patterning device (e.g. a mask or a reticle) MA and connected to a first positioner PM configured to accurately position the patterning device;
- a substrate table (e.g. a wafer table) WT constructed to hold a substrate (e.g. a resist coated wafer) W and connected to a second positioner PW configured to accurately position the substrate; and
- a projection system (e.g. a reflective projection system) PS configured to project a pattern imparted to the radiation beam B by patterning device MA onto a target portion C (e.g. comprising one or more dies) of the substrate W.

As here depicted, the apparatus 1000 is of a reflective type (e.g. employing a reflective patterning device). It is to be noted that because most materials are absorptive within the EUV wavelength range, the patterning device may have multilayer reflectors comprising, for example, a multi-stack of Molybdenum and Silicon. In one example, the multi-stack reflector has a 40 layer pairs of Molybdenum and Silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Referring to FIG. 10, the illuminator IL receives an extreme ultra violet radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. The source collector module SO may be part of an EUV radiation system including a laser, not shown in FIG. 10, for providing the laser beam exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil minor devices. The illuminator may be used to condition the radiation beam, to have a desired uniformity and intensity distribution in its cross section.

The radiation beam B is incident on the patterning device (e.g., mask) MA, which is held on the support structure (e.g., patterning device table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus 1000 could be used in at least one of the following modes:

1. In step mode, the support structure (e.g. patterning device table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. patterning device table) MT and the substrate table WT are scanned synchronously while a pattern imparted to the radiation beam is projected onto a target portion C (i.e. a single dynamic exposure). The velocity and direction of the substrate table WT relative to the support structure (e.g. patterning device table) MT may be determined by the (de-)magnification and image reversal characteristics of the projection system PS.

3. In another mode, the support structure (e.g. patterning device table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 11:
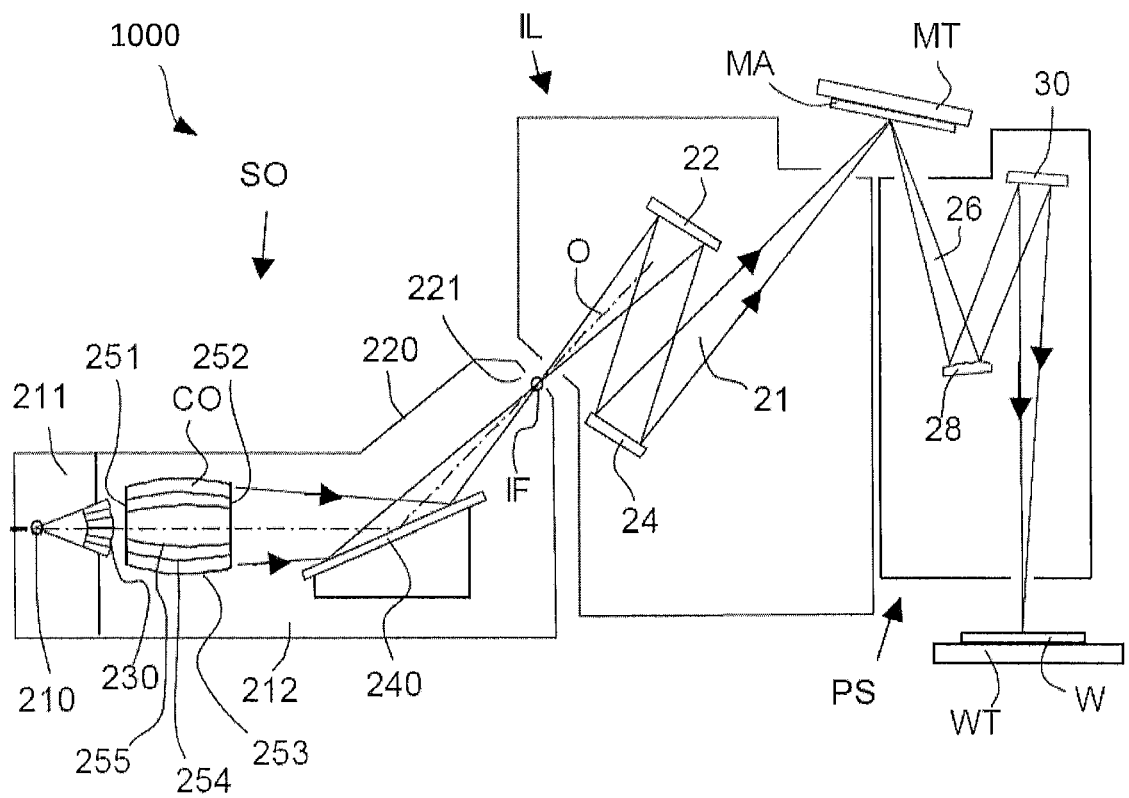
FIG. 11 is a more detailed view of the apparatus in FIG. 10.

FIG. 11 shows the apparatus 1000 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211.

The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line 'O'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination optics unit IL and projection system PS. The grating spectral filter 240 may optionally be present, depending upon the type of lithographic apparatus. Further, there may be more mirrors present than those shown in the figures, for example there may be 1-6 additional reflective elements present in the projection system PS than shown in FIG. 11.

Collector optic CO, as illustrated in FIG. 11, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type may be used in combination with a discharge produced plasma source, often called a DPP source.

Figure 12:
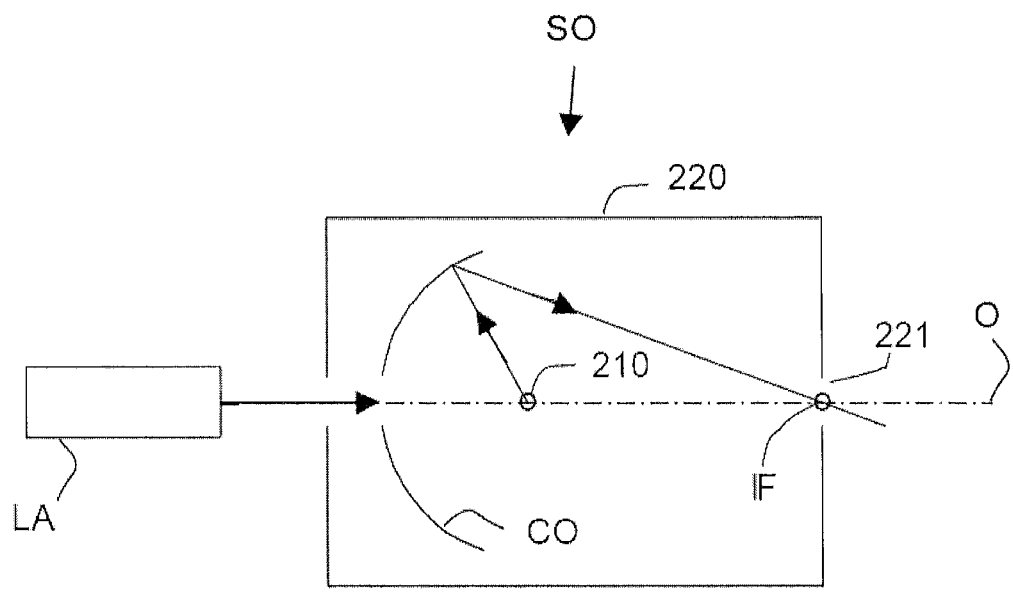
FIG. 12 is a more detailed view of the source collector module SO of the apparatus of FIG. 10 and FIG. 11.

Alternatively, the source collector module SO may be part of an LPP radiation system as shown in FIG. 12. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

The embodiments may further be described using the following clauses:

1. A method comprising:
    obtaining a value a characteristics of a portion of a design layout; determining a value of a characteristic of M3D of a patterning device comprising or forming the portion; and
    training, by a hardware computer, a neural network using training data comprising a sample whose feature vector comprises the characteristic of the portion and whose supervisory signal comprises the characteristic of M3D.

2. The method of clause 1, wherein the design layout is a binary design layout or a continuous tone design layout.

3. The method of clause 1 or clause 2, wherein the characteristic of the portion comprise a geometrical characteristic of a pattern in the portion, a statistical characteristic of a pattern in the portion, a parameterization of the portion, or an image derived from the portion.

4. The method of clause 3, wherein the characteristic of the portion comprises the parameterization of the portion and the parameterization of the portion is a projection of the portion on one or more basis functions.

5. The method of clause 3, wherein the characteristic of the portion comprises the image derived from the portion and wherein the image is a pixelated image, a binary image or a continuous tone image.

6. The method of any of clauses 1-5, wherein the characteristic of M3D comprises a parameter of a M3D mask transmission function of the patterning device.

7. The method of any of clauses 1-6, wherein the characteristic of M3D is determined based on the portion.

8. The method of any of clauses 1-7, wherein the characteristic of M3D is determined using a computational model.

9. The method of any of clauses 1-8, further comprising determining the value of the characteristic of M3D from a result of a patterning process that uses the patterning device.

10. The method of clause 9, wherein the result is an image formed on a substrate by the patterning process, or a characteristic of the image.

11. The method of any of clauses 1-10, wherein the characteristic of the portion comprises a geometric component of the portion, or a continuous tone rendering of the geometric component.

12. A method comprising:
    obtaining a value of a characteristic of a portion of a design layout;
    obtaining a value of a characteristic of a patterning process that uses a patterning device comprising or forming the portion;
    determining a value of a characteristic of a result of the patterning process; and
    training, by a hardware computer, a neural network using training data comprising a sample whose feature vector comprises the characteristic of the portion and the characteristic of the patterning process, and whose supervisory signal comprises the characteristic of the result.

13. The method of clause 12, wherein the design layout is a binary design layout or a continuous tone design layout.

14. The method of clause 12 or clause 13, wherein the characteristic of the portion comprises a geometrical characteristic of a pattern in the portion, a statistical characteristic of a pattern in the portion, a parameterization of the portion, or an image derived from the portion.

15. The method of clause 14, wherein the characteristic of the portion comprises the parameterization of the portion and the parameterization of the portion is a projection of the portion on one or more basis functions.

16. The method of clause 14, wherein the characteristic of the portion comprises the image derived from the portion and the image is a pixelated image, a binary image or a continuous tone image.

17. The method of any of clauses 12-16, wherein the characteristic of the patterning process comprises a characteristic of an illumination source of a lithographic apparatus used in a lithographic process, a characteristic of projection optics of the lithographic apparatus, a characteristic of a post-exposure procedure, or any combination selected therefrom.

18. The method of any of clauses 12-17, wherein the value of the characteristic of the result is determined based on the portion and the lithographic process.

19. The method of any of clauses 12-18, wherein the result is an image formed on a substrate by the lithographic process, or a characteristic of the image.

20. The method of any of clauses 12-19, wherein the value of the characteristic of the result is determined using a computational model.

21. The method of any of clauses 12-20, wherein the characteristic of the result is one or more selected from: critical dimension, mask error enhancement factor, a process window, a yield, and/or any combination selected therefrom.

22. The method of any of clauses 12-21, wherein the characteristic of the portion comprise a geometric component of the portion, or a continuous tone rendering of the geometric component.

23. The method of any of clauses 1-22, further comprising determining, using the neural network, a M3D mask transmission function of the patterning device.

24. The method of clause 23, further comprising determining an image produced by the patterning process, using the M3D mask transmission function.

25. The method of clause 24, wherein determining the image comprises determining an electromagnetic radiation field after radiation interacts with the patterning device by using the M3D mask transmission function and an electromagnetic radiation field of the radiation before the radiation interacts with the patterning device.

26. A computer program product comprising a non-transitory computer readable medium having instructions recorded thereon, the instructions when executed by a computer implementing a method of any of clauses 1-25.

The concepts disclosed herein may simulate or mathematically model any generic imaging system for imaging sub wavelength features, and may be especially useful with emerging imaging technologies capable of producing increasingly shorter wavelengths. Emerging technologies already in use include EUV (extreme ultra violet), DUV lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

The descriptions above are intended to be illustrative, not limiting. Thus, it will be apparent to one skilled in the art that modifications may be made as described without departing from the scope of the claims set out below.

What is claimed is:

1. A method comprising:
   obtaining a value of a characteristic of a portion of a design layout;
   determining a value of a characteristic of M3D of a patterning device comprising or forming the portion; and
   training, by a hardware computer, a neural network using training data comprising a sample whose feature vector comprises the characteristic of the portion and whose supervisory signal comprises the characteristic of M3D.

2. The method of claim 1, wherein the characteristic of the portion comprises a geometrical characteristic of a pattern in the portion, a statistical characteristic of a pattern in the portion, a parameterization of the portion, or an image derived from the portion.

3. The method of claim 1, wherein the characteristic of M3D comprises a parameter of a M3D mask transmission function of the patterning device.

4. The method of claim 1, wherein the characteristic of the portion comprises a geometric component of the portion, or a continuous tone rendering of the geometric component.

5. A method comprising:
   obtaining a value of a characteristic of a portion of a design layout;
   obtaining a value of a characteristic of a patterning process that uses a patterning device comprising or forming the portion;
   determining a value of a characteristic of a result of the patterning process; and
   training, by a hardware computer, a neural network using training data comprising a sample whose feature vector comprises the characteristic of the portion and the characteristic of the patterning process, and whose supervisory signal comprises the characteristic of the result, wherein the neural network is configured to output a characteristic of M3D of a patterning device comprising or forming the portion.

6. A non-transitory computer-readable medium comprising instructions therein, the instructions, upon execution by a computer system, configured to cause the computer system to at least:
   obtain a value of a characteristic of a portion of a design layout;
   obtain a value of a characteristic of a patterning process that uses a patterning device comprising or forming the portion;
   determine a value of a characteristic of a result of the patterning process; and train a neural network using training data comprising a sample whose feature vector comprises the characteristic of the portion and the characteristic of the patterning process, and whose supervisory signal comprises the characteristic of the result, wherein the neural network is configured to output a characteristic of M3D of a patterning device comprising or forming the portion.

7. The computer-readable medium of claim 6, wherein the design layout is a binary design layout or a continuous tone design layout.

8. The computer-readable medium of claim 6, wherein the characteristic of the portion comprises a geometrical characteristic of a pattern in the portion, a statistical characteristic of a pattern in the portion, a parameterization of the portion, or an image derived from the portion.

9. The computer-readable medium of claim 8, wherein the characteristic of the portion comprises the parameterization of the portion and the parameterization of the portion is a projection of the portion on one or more basis functions, and/or
   wherein the characteristic of the portion comprises the image derived from the portion and the image is a pixelated image, a binary image or a continuous tone image.

10. The computer-readable medium of claim 6, wherein the characteristic of the patterning process comprises a characteristic of an illumination source of a lithographic apparatus used in a lithographic process, a characteristic of projection optics of the lithographic apparatus, a characteristic of a post-exposure procedure, or any combination selected therefrom.

11. A non-transitory computer-readable medium comprising instructions therein, the instructions, upon execution by a computer system, configured to cause the computer system to at least:
   obtain a value of a characteristic of a portion of a design layout;
   determine a value of a characteristic of M3D of a patterning device comprising or forming the portion; and
   train a neural network using training data comprising a sample whose feature vector comprises the characteristic of the portion and whose supervisory signal comprises the characteristic of M3D.

12. The computer-readable medium of claim 11, wherein the characteristic of the portion comprises a geometrical characteristic of a pattern in the portion, a statistical characteristic of a pattern in the portion, a parameterization of the portion, or an image derived from the portion.

13. The computer-readable medium of claim 12, wherein the characteristic of the portion comprises the parameterization of the portion and the parameterization of the portion is a projection of the portion on one or more basis functions.

14. The computer-readable medium of claim 12, wherein the characteristic of the portion comprises the image derived from the portion and wherein the image is a pixelated image, a binary image or a continuous tone image.

15. The computer-readable medium of claim 11, wherein the instructions are further configured to cause the computer system to determine the value of the characteristic of M3D from a result of a patterning process that uses the patterning device.

16. The computer-readable medium of claim 11, wherein the design layout is a binary design layout or a continuous tone design layout.

17. The computer-readable medium of claim 11, wherein the characteristic of M3D comprises a parameter of a M3D mask transmission function of the patterning device.

18. The computer-readable medium of claim 11, wherein the characteristic of M3D is determined based on the portion.

19. The computer-readable medium of claim 11, wherein the characteristic of M3D is determined using a computational model.

20. The computer-readable medium of claim 11, wherein the characteristic of the portion comprises a geometric component of the portion, or a continuous tone rendering of the geometric component.

* * * * *